United States Patent [19]

Kusian et al.

[11] Patent Number: 5,527,716
[45] Date of Patent: Jun. 18, 1996

[54] METHOD OF MAKING INTEGRATED-CIRCUIT STACKED-CELL SOLAR MODULE

[75] Inventors: Wilhelm Kusian, München, Germany; Joze Furlan, SI-Ljubljana, Slovenia; Wolfgang Riedl; Hans Pfleiderer, both of München, Germany

[73] Assignee: Siemens Aktiengesellschaft, Munich, Germany

[21] Appl. No.: 284,444

[22] PCT Filed: Jan. 22, 1993

[86] PCT No.: PCT/DE93/00051

§ 371 Date: Aug. 3, 1994

§ 102(e) Date: Aug. 3, 1994

[87] PCT Pub. No.: WO93/15527

PCT Pub. Date: Aug. 5, 1993

[30] Foreign Application Priority Data

Feb. 4, 1992 [DE] Germany ............... 42 03 123.0

[51] Int. Cl.$^6$ ................................. H01L 31/20
[52] U.S. Cl. .................... 437/4; 437/2; 437/51; 437/205; 437/208; 136/244; 136/249
[58] Field of Search ............... 136/244, 249 TJ; 437/2, 4–5, 51, 64–65, 205, 208

[56] References Cited

U.S. PATENT DOCUMENTS 4,784,701 11/1988 Sakai et al. .................. 136/249 TJ
4,948,436 8/1990 Juergens ..................... 136/249 TJ

FOREIGN PATENT DOCUMENTS 0326857 8/1989 European Pat. Off. .............. 136/244
0334111 9/1989 European Pat. Off. .............. 136/244
0536431 4/1993 European Pat. Off. .............. 136/244
3709153 10/1987 Germany ........................... 136/244
1-293575 11/1989 Japan ............................ 136/249 TJ

OTHER PUBLICATIONS

Patent Abstract of Japan, vol. 12, No. 375 (E–666)7. Oct. 1988 & JP, A, 63–122 283.
Patent Abstracts of Japan, vol. 10, No. 244 (E–430) (2300) 22. Aug. 1986 & JP, A 61–75 567.
W. Juergens et al., "Economical Patterning of Series Connected a–Silicon Modules", Seventh E.C. Photovoltaic Solar Energy Conference, pp. 494–503 (1986).

*Primary Examiner*—Aaron Weisstuch
*Attorney, Agent, or Firm*—Hill, Steadman & Simpson

[57] ABSTRACT

Individual solar cells are disposed in a stacked-cell solar module alternately as p-i-n, n-i-p, p-i-n and so on, the solar-cell stack is patterned in strip-like fashion and the interconnection is carried out by means of comb-like electrode structures which connect the p-type sides of the solar cells of a stack to the n-type sides of the solar cells of the adjacent stack. The solar module, which can be produced in integrated form is connected in parallel within a stack and in series between the stacks. By simply repeating the manufacturing steps, stacks can be built in this way from two or more solar cells, which have a reduced light aging compared with known solar modules.

4 Claims, 2 Drawing Sheets

METHOD OF MAKING INTEGRATED-CIRCUIT STACKED-CELL SOLAR MODULE

BACKGROUND OF THE INVENTION

1. Field of the Invention

The present invention relates generally to a multilayer integrated-circuit solar module in which a plurality of stacks of layers of thin-layer solar cells are disposed alongside one another on a substrate.

2. Description of the Related Art

On exposure to light, solar cells and solar modules comprising amorphous silicon (a-Si:H) exhibit a substantial deterioration in the electrical power, which may amount to 40 percent of the original power. Although this aging process which occurs during the operation of the solar cells can be reversed by heat treatment at 180° C., it starts again on exposure to light.

One way of avoiding this aging effect, which is also referred to as the Staebler-Wronski effect in solar cells, is to use mixed semiconductors having a smaller band gap to produce the active i-type layer. It is also possible to produce p-i-n solar cells comprising amorphous silicon with thinner i-type layers which exhibit hardly any aging below a layer thickness of approximately 300 nm. However, such a thin i-type layer only incompletely absorbs the red component of the solar spectrum with the result that an unduly low short-circuit current is obtained with these cells.

One way of producing solar cells having thinner i-type layers but high red absorption is offered by stacked cells. Such a stacked cell made up of two or more individual cells which are each thin on their own absorbs an adequate portion of the sunlight. A double cell has the structure p-i-n/p-i-n, a triple cell has the structure p-i-n/p-i-n/p-i-n, and so on. The i-type layers of the subcells of a stack may comprise the same semiconductor material or be produced from various semiconductor materials, for example from silicon/carbon or silicon/germanium alloys.

Tandem cells or, generally, stacked cells, have in fact a higher resistance to light aging, with a constant or even a higher efficiency. In such cases, the cells in a stack are optically arranged one behind the other and, in the simplest case, are electrically connected in series. The photovoltages of cells situated one above the other are added together, while the photocurrents must be identical. The maximum achievable photocurrent in such a stacked cell is determined by the photocurrent of the weakest individual cell.

The current adjustment or, alternatively, the "current matchings" can, however, be carried out only with difficulty, in particular in the production of large-area solar modules. Layer thickness variations in the deposition of the active semiconductor layer occur to a greater extent with increasing substrate area and affect the photocurrent.

In order to avoid the problem of current matching, European Patent Application 0 326 857 and corresponding U.S. Pat. No. 4,948,436 proposed for the first time to use stacked cells having a p-i-n-i-p or n-i-p-i-n structure and to interconnect them in an integrated manner in a module. In this arrangement, the two solar cells, situated one above the other, of the tandem cell are connected electrically in parallel, in which case the photocurrents of the subcells are added together. Only a voltage adjustment of the subcells is necessary in order to have photovoltages which are as identical as possible. Since, however, there is only a slight dependence of the photovoltage on the photocurrent in the working range of a solar cell, the voltage matching of a tandem cell or stacked cell having a parallel interconnection can be carried out markedly more easily than a current matching in the case of a series connection.

A disadvantage of the known tandem solar module having a parallel interconnection is the structure, which is complicated compared with a simple thin-layer solar module, which requires an edge insulation in the isolating trenches, or grooves, between the stacked cells and in which contact is made via steps in the layers for the purpose of interconnection.

SUMMARY OF THE INVENTION

An object of the present invention is therefore to provide a simplified structure for a stacked-cell solar module which can easily be produced using known thin-layer patterning techniques and, at the same time, ensures a technologically simple and reliable interconnection, also with simultaneous minimum loss of active semiconductor area.

This and other objects and advantages of the invention are achieved, according to the invention, by a multilayer solar module in which a plurality of stacks of n layers of thin-layer solar cells in each case are disposed in strip-like fashion alongside one another on a substrate, having the features:

a) the solar cells each have a p-n junction or a p-i-n structure, b) the polarity of the semiconductor junction is reversed in each case from one solar-cell layer to the solar-cell layer situated on top thereof, c) the electrode layers form, together with their interconnections disposed between the stacks, regular structures which each have the form of a double comb having n+1 teeth in a cross-sectional plane perpendicular to the strip-like stacks, the teeth of the double comb being formed by the electrode layers and the spine of the double comb, which spine is perpendicular to the substrate, being formed by the interconnection and the teeth being disposed alternately on either side of the back, d) in a stack, the teeth of two adjacent double combs mesh with one another in a contact-free manner, a solar cell being disposed between every two teeth, e) the electrode layers of all the p-type sides of the solar cells in a stack being connected electrically to all the electrode layers of the n-type sides of an adjacent stack by the interconnection so that all the solar cells of a stack are connected electrically in parallel and the stack is connected in series via the module and n being $\geq 2$.

Further developments of the invention include the electrode layers being of transparent conductive oxide. Another feature of the invention is that the solar cells comprise amorphous silicon. Preferably, the solar module has each stack comprising two solar cell layers (n=2). A method of producing the solar module includes the following steps:

a) production of a transparent electrode layer on a transparent substrate over the entire surface, b) strip-like patterning of the first electrode layer, c) production of a first thin-layer solar cell having a p-i-n or p-n structure over the entire surface on top of the first electrode layer patterned in strip-like fashion, d) patterning of the first thin-layer solar cell in parallel with, and offset laterally in one direction with respect to, the strips of the first electrode layer in such a way that the surface of the strips of the first electrode layer are laid bare in the trenches, or grooves, separating the strip-like solar cells, e) deposition of a second transparent electrode layer over the entire surface, f) strip-like patterning of the second electrode layer by trenches, or grooves, in parallel with, and offset laterally in the direction with respect to, the trenches, or grooves, which have been produced in the patterning of the strip-like first thin-layer solar cell, g) deposition of a second thin-layer solar cell over the entire surface having an inverse structure in relation to the polarity of the semiconductor junction compared with the first thin-layer solar cell, h) patterning of the second thin-layer solar cell in accordance with the patterning of the first thin-layer solar cell, i) production of a third electrode layer over the entire surface, and j) patterning of the third electrode layer in accordance with the patterning of the first electrode layer.

The method is further defined wherein at least one further thin-layer solar cell and at least one further electrode layer are produced and patterned on top of the third electrode layer by repeating the steps g) to j), the polarity of each further thin-layer solar cell being inverse with respect to the solar cell situated underneath in each case and the patterning of all the solar-cell layers being identical, while an electrode layer x is patterned according to the patterning of the electrode layer (x−2).

A laser is used to pattern the solar cells and the electrode layers in a preferred embodiment.

The method may include a lift-off procedure to pattern the electrode layers and/or the solar-cell layers.

When a glass substrate is used, electrically conductive, transparent doped metal oxides are used as the electrode material, the thin-layer solar cells are produced from amorphous silicon having p-i-n structure, and the number n of solar cells situated one above the other is 2 to 4.

Preferably, a metal layer is produced as an uppermost electrode layer and the uppermost electrode layer, including the solar cell situated underneath, is patterned using a laser, the laser irradiation being carried out through the substrate and through the transparent electrode layers situated underneath the layer to be patterned.

The module according to the invention comprises only regular structures and, consequently, has a simple structure whose production requires no additional technological expenditure compared with thin-layer solar modules and is therefore compatible with known modules from a manufacturing point of view.

The possible number n of thin-layer solar cells laminated in the stack is variable in the case of the structure according to the invention and is not less than 2. As a result, the individual solar cells can be made as thin as desired and the light aging can consequently be reduced. Simultaneously, a high degree of light absorption is guaranteed since the lower absorption of a thinner layer can be compensated for by a higher number of solar cells in the stack. The total layer thickness of the n thin-layer solar cells in the stack is ultimately responsible for the total absorption.

In the strip-like solar-cell stack, the individual solar cells can be disposed exactly one above the other, with the result that only a minimum loss of active semiconductor area is required by the interconnection in the module, which loss is equivalent only to a trench, or groove, width per strip or per stack, that is to say no more than in known thin-layer modules.

In principle, the novel module structure is suitable for all integrated, patternable semiconductor materials and, consequently, for virtually all semiconductors suitable for thin-layer solar cells. In particular, the latter are amorphous layers comprising silicon (a-Si:H) or its alloys, for example with germanium (a-Si/Ge:H), and cells comprising pure germanium (a-Ge:H) or polycrystalline chalcopyrite materials, for example comprising copper indium diselenide or copper gallium diselenide. The module structure according to the invention is always particularly advantageous if the semiconductor layers are as thin as possible, that is to say the layers are of those materials which exhibit, for example, a light aging or in which the production of thicker layers is technologically impeded.

In the solar module according to the invention, a voltage matching is required in order not to experience any losses in the module power. This does not necessarily require identical materials for the solar cells in the stack, but identical materials are desirable and advantageous.

Consequently, the light in the usable portion of the spectrum can be absorbed virtually completely without resulting in a power loss in the module. High photocurrents and, consequently, a high efficiency are therefore obtained.

Although that side of the stack structure which is remote from the substrate can be used as the light incidence side, the substrate side is nevertheless preferred. Glass is therefore usually chosen as a substrate material, whereas known TCO materials, for example doped metal oxides such as fluorine-doped tin oxide ($SnO_2$:F), boron-doped zinc oxide (ZnO:B) or indium tin oxide (ITO) and others, can be used for the transparent conductive electrodes. The uppermost electrode layer may also comprise TCO or a metal layer in order to reflect light into the solar cells that is not absorbed in the stack.

Although the number n of solar cell layers in the stack can be increased as desired, a minimum number of cells is nevertheless preferred in practice in order to limit the manufacturing expenditure for the many layers required. In addition, the advantageous effect of the invention is already completely manifested in a tandem module (n=2) and more than two layers are therefore seldom required.

BRIEF DESCRIPTION OF THE DRAWINGS

The invention is explained in greater detail below with reference to an exemplary embodiment and the associated eight figures. In the figures:

FIGS. 1 to 5 show a substrate to which is applied layers during various steps in the method in the case of the production of a stacked module having two solar cell layers in diagrammatic cross-section, while

DETAILED DESCRIPTION OF THE PREFERRED EMBODIMENTS

Figure 1:
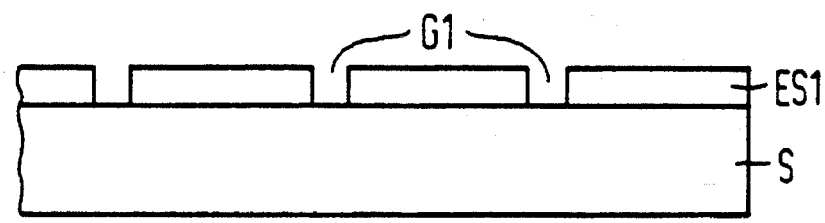

In FIG. 1: A first electrode layer ES1 is deposited, for example by PECVD (plasma-enhanced chemical vapor deposition) or by sputtering TCO materials, over the entire surface of a glass substrate S having a thickness of, for example, 2 mm. The first electrode layer is then patterned using a laser, so that narrow trenches, or grooves, G1, which are parallel to one another, are produced by removing the electrode material. Electrode strips are left which have a width, for example, of 1 to 5 cm. The width of the trenches, or grooves, G1 is chosen to be as small as possible and, for one laser used, is, for example, 50 pm.

Figure 2:
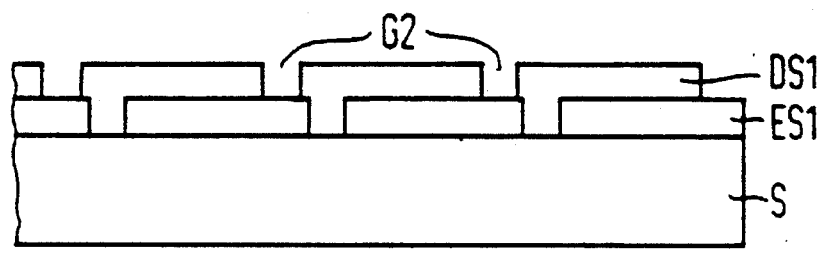

In FIG. 2: A first thin-layer solar cell DS1, in the present case an a-Si:H p-i-n diode, is now produced on top of the strips of the first electrode layer ES1 over the entire surface using a PECVD process. The first thin-layer solar cell DS1 is now patterned, also using a laser, to that trenches, or grooves, G2, which are parallel to the first trenches, or grooves, G1, are produced. The trenches, or grooves, G2 are offset laterally by at least one trench, or groove, width with respect to the trenches, or grooves, G1, with the result that the surface of the first electrode layer ES1 is laid bare at the base of the trenches, or grooves, G2.

Figure 3:
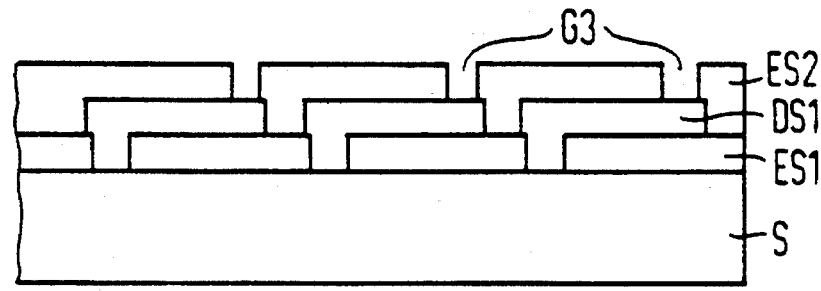

In FIG. 3: A second electrode layer ES2 is now applied on top of the solar cell DS1 over the entire surface and is patterned in the same way using a laser. Third trenches, or grooves, G3 are produced which are offset by at least one further trench, or groove, width in the same direction with respect to G2 and the surface of the thin-layer solar cell DS1 is exposed at the same time.

Figure 4:
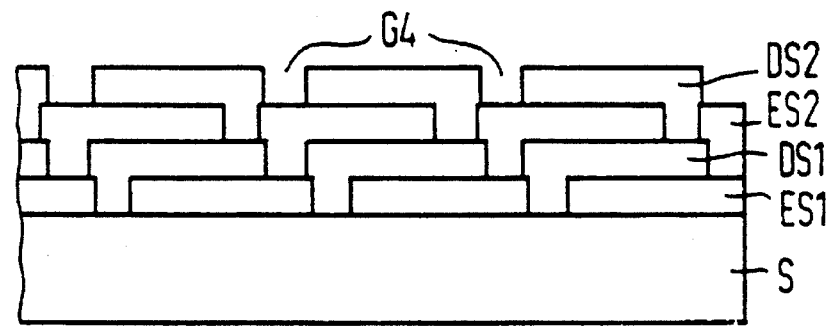

In FIG. 4: In the next step, a second thin-layer solar cell DS2 is produced over the entire surface, the solar cell having an inverse structure, in this case an n-i-p structure, in relation to the direction of its semiconductor junction compared with the first solar cell DS1. This is followed by a further laser patterning step which produces trenches, or grooves, G4 which are situated directly above the trenches, or grooves, G2.

Figure 5:
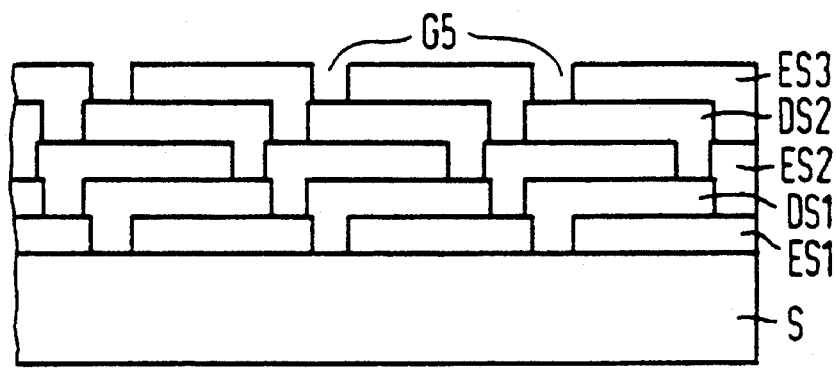

In FIG. 5: As the last step in producing a finished tandem solar cell module, a third TCO electrode layer ES3 is produced in an analogous way to the first electrode layer ES1 and is patterned.

Within the scope of the invention, the exemplary structure shown in FIG. 5 for a tandem solar cell module according to the invention can be varied still further. For example, solar cells of different thickness can be disposed one above the other in the stack, the second solar cell DS2 preferably having a greater layer thickness. In the exemplary embodiment, the first solar cell DS1 could, for example, have a thickness of 300 nm and the second solar cell DS2 a thickness of 300 to 500 nm. The lower limit of a possible layer thickness is determined not by physical, but by technological parameters. In a p-i-n solar cell, a photocurrent is observed even from a layer thickness of approximately 25 nm upwards. Because of layer-thickness variations or unevenness in the structure of the substrate or of one of the layers deposited thereon, there is, however, the danger in the case of thin layers of a short circuit between two electrode layers in a stack, which short circuit could reduce the power of the module. Layer thicknesses which can be produced with higher technological reliability are therefore preferred. The thickness of the electrode layers is devised in accordance with their conductivity. If boron-doped zinc oxide is used, a thickness of approximately 1 pm is adequate. However, a larger structure width or a larger spacing between two adjacent trenches, or grooves, G in a layer may require a higher conductivity of an electrode layer ES and, consequently, a greater layer thickness.

The structure width is generally determined by the size of the substrate chosen. Enough strip-like solar cell stacks which are produced for the cell voltages of the solar cell stacks connected electrically in series to add up to a total voltage of 12 to 14 volts at the working point. Since the voltage of an individual cell comprising a-Si:E is approximately 0.6 to 0.8 volt, approximately 20 or more strips are necessary for the desired final voltage. At the same time, the width of a strip may be up to 5 cm.

Figure 6:
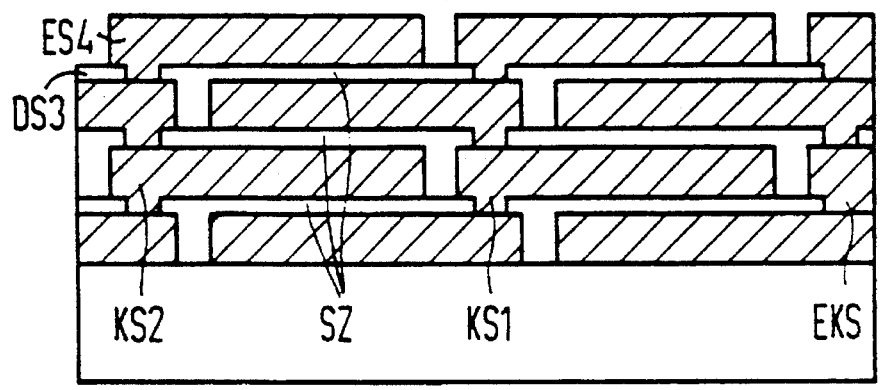
FIG. 6 shows a cross section of a module according to the invention having three solar cell layers.

FIG. 6 shows a stacked-cell solar module, according to the invention, comprising three layers of thin-layer solar cells in the stack. For this purpose, a further thin-layer solar cell DS3 having a p-i-n structure is deposited on the tandem-cell structure (see FIG. 5) and is patterned in the same way as the first and second thin-layer solar cell DS1 or DS2. The rear electrode is formed by a fourth electrode layer ES4, which is produced in the same way as the second electrode layer ES2 and is patterned in registration with the latter in order to minimize the loss of active semiconductor area.

This diagram shows well how the electrode strips ES form comb-like structures KS in cross-section. That axis of electrode material which is formed by the original trenches, or grooves, G2 and G4 is the back or spine of the comb. The teeth, which point alternately to either side, are the electrode layers for the solar cells. Or to put it another way: the electrodes of a solar-cell stack SZ are formed alternately by a first comb-like structure KS1 and a second comb-like structure KS2, which structures mesh in a contact-free manner (to avoid short circuits) with one another or with the solar-cell stack SZ. The outer comb structures ERS at the periphery of the module are constructed analogously to the central comb-like structures RS but are adjacent to only one solar-cell stack and therefore have teeth or electrode strips ES pointing only to one side. At the end structures EKS, the electrical contacting required to connect the module to a load or to a storage unit also takes place.

If a metal layer is applied over the entire surface as an uppermost electrode layer ES3 (n=2), a direct patterning from above by means of a laser is impossible or is possible only with great difficulty if the solar-cell layer DS2 situated underneath in the region of the trenches, or grooves, G5 and laid bare is not to be changed structurally at the same time during the process, in which case the danger of a short circuit in the solar cell exists. For this patterning step, irradiation can alternatively be carried out by means of a laser through the glass substrate from the substrate side, as is proposed, for example, in the earlier European Application EP-A-536431. Strong local heating at the interface between the second solar cell DS2 and the second electrode layer ES2 at the focus of the laser used for patterning results in a peeling of the second solar-cell layer and the third electrode layer ES3 situated on top thereof in the region of the focus. For this step, it is, however, necessary for the trench, or groove, width G2 to be markedly greater than the trench, or groove, width G4 so that the laser beam that is incident through the substrate S "sees" only one interface between a solar-cell layer DS and an electrode layer ES (here ES2/DS2). For this variant of the method, the trench, or groove, width G2 therefore has to be calculated at least from the sum of the trench, or groove, widths G4 and G5 plus a tolerance value which results from the tolerance of the cutting device (laser) and the alignment accuracy of the device.

However, in the case of continued layer stacking (n greater than 2) a patterning through the substrate S is no longer possible. As an alternative to conventional laser patterning methods from "above" a lift-off procedure can be used, as also in all the other patterning steps. For this purpose, prior to the production or deposition of a layer to be patterned in the region of the future trenches, or grooves, G, a patterning paste which is capable of being lifted off is applied, for example with the aid of screen printing. After the production of the layer to be patterned on top of the printed-on paste, the latter is removed mechanically, in which process the layer to be structured that is situated on top thereof is lifted off at the same time in the region of the paste. Any laser patterning step can therefore be replaced in the method by the steps, needed for the lift-off procedure, of "printing-on" a patterning paste in the region of the patterning lines (trenches) and of "lifting-off" patterning paste together with the layer regions situated on top thereof. These two steps are technologically easy to carry out and are therefore a true alternative to laser patterning.

Figure 7:
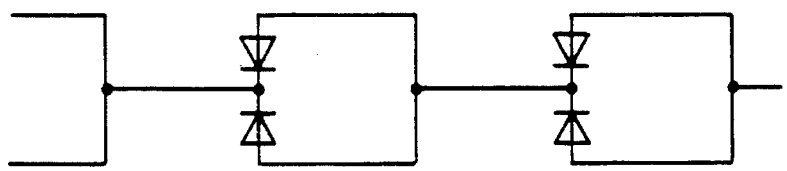
In FIGS. 7 and 8, the equivalent circuit diagrams are shown for modules having n=2 and n=3.

FIG. 7 shows an equivalent circuit diagram for the stacked-cell solar module shown in FIG. 5. The solar cells are represented as diodes in accordance with the direction of their semiconductor junction, while the connecting lines shown stand for the comb-like electrode structures.

Figure 8:
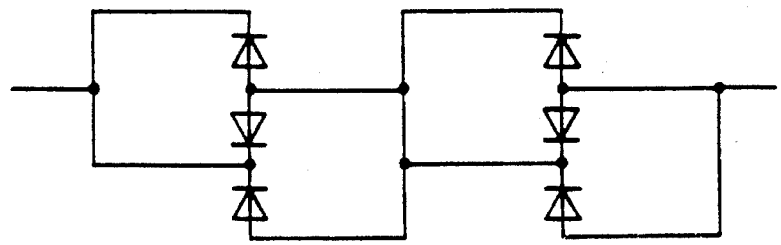

FIG. 8 shows the equivalent circuit diagram of a stacked-cell solar module comprising three solar-cell layers (see FIG. 6). It can readily be seen that the solar cells (diodes) in the stack are connected in parallel, but via the stack in series.

Although other modifications and changes may be suggested by those skilled in the art, it is the intention of the inventors to embody within the patent warranted hereon all changes and modifications as reasonably and properly come within the scope of their contribution to the art.

We claim:

1. A method of producing an integrated-circuit stacked-cell solar module, comprising the following steps:

a) producing a transparent electrode layer as a first electrode layer on a transparent substrate over an entire surface of said transparent substrate, b) forming strip-like patterning of said first electrode layer, c) depositing a first thin-layer solar cell of amorphous silicon having a p-i-n structure over the entire surface on top of said first electrode layer, d) patterning said first thin-layer solar cell in parallel with, and offset laterally in one direction with respect to, said strip-like patterning of said first electrode layer in such a way that a surface of said strip-like patterning of said first electrode layer is laid bare in trenches separating the strip-like solar cells from one another, said patterning being accomplished by a laser or by a lift-off method, e) depositing a second transparent electrode layer over the entire surface, f) strip-like patterning of the second transparent electrode layer by trenches formed in parallel with, and offset laterally in the direction with respect to, the trenches which have been produced in the patterning of the first thin-layer solar cell, said patterning being accomplished by a laser or by a lift-off method, g) depositing a second thin-layer solar cell over the entire surface having an inverse structure in relation to a polarity of the semiconductor junction therein compared with the first thin-layer solar cell, h) patterning the second thin-layer solar cell in accordance with the patterning of the first thin-layer solar cell, said patterning being accomplished by a laser or by a lift-off method, i) producing a third electrode layer over the entire surface, and j) patterning the third electrode layer in accordance with the patterning of the first electrode layer, said patterning being accomplished by a laser or by a lift-off method.

2. A method as claimed in claim 1, further comprising the steps of:

producing at least one further thin-layer solar cell on said third electrode layer;

patterning said at least one further thin-layer solar cell;

producing at least one further electrode layer on said at least one further thin-layer solar cell;

patterning said at least one further electrode layer by repeating the steps g) to j), the polarity of each further thin-layer solar cell being inverse with respect to the solar cell situated underneath in each case and the patterning of all the solar-cell layers being identical, while an electrode layer x is patterned according to the patterning of the electrode layer (x−2).

3. A method as claimed in claim 1, wherein a glass substrate is used, electrically conductive, transparent doped metal oxides are used as electrode material, the thin-layer solar cells are produced from amorphous silicon having a p-i-n structure and the number n of solar cells situated one above the other is 2 to 4.

4. A method as claimed in claim 1, wherein a metal layer is produced as uppermost electrode layer and wherein the uppermost electrode layer, including the solar cell situated underneath, is patterned using a laser, irradiation being carried out through the substrate and through the transparent electrode layers situated underneath the layer to be patterned.

* * * * *